US012765420B2

(12) United States Patent
Sun et al.

(10) Patent No.: US 12,765,420 B2
(45) Date of Patent: Oct. 13, 2026

(54) SEMICONDUCTOR PACKAGE STRUCTURE AND MANUFACTURING METHOD

(71) Applicant: CHANGXIN MEMORY TECHNOLOGIES, INC., Hefei City (CN)

(72) Inventors: Xiaofei Sun, Hefei City (CN); Changhao Quan, Hefei City (CN)

(73) Assignee: CHANGXIN MEMORY TECHNOLOGIES, INC., Hefei City (CN)

(*) Notice: Subject to any disclaimer, the term of this patent is extended or adjusted under 35 U.S.C. 154(b) by 642 days.

(21) Appl. No.: 18/154,739

(22) Filed: Jan. 13, 2023

(65) Prior Publication Data

US 2024/0014189 A1 Jan. 11, 2024

Related U.S. Application Data

(63) Continuation of application No. PCT/CN2022/109430, filed on Aug. 1, 2022.

(30) Foreign Application Priority Data

Jul. 8, 2022 (CN) ......................... 202210806439.8

(51) Int. Cl.
*H01L 25/10* (2006.01)
*H10W 74/01* (2026.01)
(Continued)

(52) U.S. Cl.
CPC ........... *H10W 90/00* (2026.01); *H10W 74/01* (2026.01); *H10W 74/117* (2026.01);
(Continued)

(58) Field of Classification Search
None
See application file for complete search history.

(56) References Cited

U.S. PATENT DOCUMENTS 7,026,709 B2 4/2006 Tsai et al.
7,354,800 B2 4/2008 Carson
(Continued)

FOREIGN PATENT DOCUMENTS

CN 1731917 A 2/2006
CN 101075596 A 11/2007
(Continued)

OTHER PUBLICATIONS

Partial Supplementary European Search Report in the European application No. 22830682.5, mailed on Dec. 6, 2023. 19 pages.
(Continued)

*Primary Examiner* — Long Pham
(74) *Attorney, Agent, or Firm* — SYNCODA LLC; Feng Ma

(57) ABSTRACT

A semiconductor package structure includes: a first base plate provided with a first surface; a first chip stack body located on the first base plate, where the first chip stack body includes a plurality of first semiconductor chips successively stacked onto one another in a direction perpendicular to the first base plate, and is electrically connected to the first surface of the first base plate; an interposer layer located on the chip stack body and provided with a first interconnection surface, where the first interconnection surface is provided with a first interconnection region electrically connected to the first base plate and a second interconnection region; and a molding layer configured to seal the first chip stack body, the interposer layer and the first surface of the first base plate. The first interconnection region is unsealed by the molding layer, and the second interconnection region is sealed by the molding layer.

17 Claims, 15 Drawing Sheets

(51) Int. Cl.

| | |
|---|---|
| ***H10W 74/10*** | (2026.01) |
| ***H10W 90/00*** | (2026.01) |
| *H10W 72/00* | (2026.01) |
| *H10W 90/24* | (2026.01) |

(52) U.S. Cl.

CPC ........ *H10W 90/701* (2026.01); *H10W 72/075* (2026.01); *H10W 90/24* (2026.01); *H10W 90/754* (2026.01)

(56) References Cited

U.S. PATENT DOCUMENTS

| | | | | |
|---|---|---|---|---|
| 7,723,159 | B2 * | 5/2010 | Do ...................... | H10W 20/023 438/126 |
| 7,800,211 | B2 | 9/2010 | Yang et al. | |
| 7,927,917 | B2 | 4/2011 | Pagaila et al. | |
| 8,198,735 | B2 * | 6/2012 | Chow ................. | H10W 74/117 257/777 |
| 8,227,925 | B2 | 7/2012 | Song et al. | |
| 8,309,397 | B2 * | 11/2012 | Shim ................... | H10W 74/117 257/730 |
| 8,699,232 | B2 * | 4/2014 | Choi ..................... | H10W 90/00 361/767 |
| 8,962,393 | B2 * | 2/2015 | Pagaila ................. | H10W 42/20 257/706 |
| 9,595,509 | B1 | 3/2017 | Yap | |
| 10,410,968 | B2 | 9/2019 | Park | |
| 11,211,334 | B2 | 12/2021 | Lin et al. | |
| 2003/0219969 | A1 | 11/2003 | Saito et al. | |
| 2004/0145039 | A1 | 7/2004 | Shim et al. | |
| 2005/0023657 | A1 | 2/2005 | Tsai et al. | |
| 2006/0244157 | A1 | 11/2006 | Carson | |
| 2008/0157325 | A1 * | 7/2008 | Chow ................. | H10W 74/117 438/109 |
| 2008/0227238 | A1 | 9/2008 | Ko et al. | |
| 2009/0001540 | A1 | 1/2009 | Yang et al. | |
| 2009/0079091 | A1 * | 3/2009 | Song ................... | H10W 74/141 438/109 |
| 2009/0085225 | A1 | 4/2009 | Park | |
| 2009/0091015 | A1 | 4/2009 | Shen et al. | |
| 2009/0236718 | A1 | 9/2009 | Yang | |
| 2009/0243068 | A1 | 10/2009 | Kuan et al. | |
| 2010/0046183 | A1 | 2/2010 | Park et al. | |
| 2010/0072593 | A1 | 3/2010 | Kim et al. | |
| 2010/0148354 | A1 | 6/2010 | Choi et al. | |
| 2010/0244221 | A1 | 9/2010 | Ko et al. | |
| 2010/0258930 | A1 | 10/2010 | Oh | |
| 2010/0320582 | A1 | 12/2010 | Pagaila et al. | |
| 2011/0062591 | A1 | 3/2011 | Choi et al. | |
| 2011/0127662 | A1 | 6/2011 | Yang et al. | |
| 2011/0133325 | A1 * | 6/2011 | Moon ................... | H10W 90/00 257/E21.511 |
| 2011/0193205 | A1 | 8/2011 | Hsieh | |
| 2012/0146243 | A1 | 6/2012 | Song et al. | |
| 2012/0217645 | A1 | 8/2012 | Pagaila | |
| 2012/0319267 | A1 | 12/2012 | Moon et al. | |
| 2013/0075889 | A1 | 3/2013 | Pagaila | |
| 2014/0103527 | A1 | 4/2014 | Marimuthu et al. | |
| 2014/0291821 | A1 | 10/2014 | Song | |
| 2015/0102506 | A1 | 4/2015 | Song et al. | |
| 2015/0115466 | A1 | 4/2015 | Kim | |
| 2015/0270232 | A1 | 9/2015 | Chen | |
| 2016/0172337 | A1 | 6/2016 | Kim | |
| 2016/0343691 | A1 | 11/2016 | Chen et al. | |
| 2017/0069607 | A1 | 3/2017 | Yap | |
| 2017/0141043 | A1 | 5/2017 | Park | |
| 2017/0228529 | A1 | 8/2017 | Huang et al. | |
| 2018/0005974 | A1 | 1/2018 | Chiu et al. | |
| 2019/0013299 | A1 | 1/2019 | Lee | |
| 2019/0252772 | A1 | 8/2019 | Ndip | |
| 2019/0296002 | A1 | 9/2019 | Pei et al. | |
| 2019/0378826 | A1 | 12/2019 | Kim | |
| 2020/0020637 | A1 | 1/2020 | Kim et al. | |
| 2020/0066663 | A1 | 2/2020 | Aleksov et al. | |
| 2020/0194331 | A1 | 6/2020 | Kim et al. | |
| 2020/0312783 | A1 | 10/2020 | Min et al. | |
| 2020/0381406 | A1 | 12/2020 | Dominguez et al. | |
| 2021/0035895 | A1 | 2/2021 | Oh et al. | |
| 2021/0035913 | A1 | 2/2021 | Park et al. | |
| 2021/0050294 | A1 | 2/2021 | Tsai et al. | |
| 2021/0343617 | A1 | 11/2021 | Kim et al. | |
| 2021/0351172 | A1 | 11/2021 | Pei et al. | |
| 2022/0122896 | A1 | 4/2022 | Wang et al. | |
| 2022/0130764 | A1 | 4/2022 | Lin et al. | |
| 2022/0199549 | A1 | 6/2022 | Min et al. | |
| 2022/0199593 | A1 | 6/2022 | Yang et al. | |
| 2023/0052194 | A1 | 2/2023 | Kim | |

FOREIGN PATENT DOCUMENTS

| | | | |
|---|---|---|---|
| CN | 101127344 | A | 2/2008 |
| CN | 103219296 | A | 7/2013 |
| CN | 204102862 | U | 1/2015 |
| CN | 104576557 | A | 4/2015 |
| CN | 105161435 | A | 12/2015 |
| CN | 106711094 | A | 5/2017 |
| CN | 107527877 | A | 12/2017 |
| CN | 104576557 | B | 8/2018 |
| CN | 110581121 | A | 12/2019 |
| CN | 110718528 | A | 1/2020 |
| CN | 110797325 | A | 2/2020 |
| CN | 111819689 | A | 10/2020 |
| CN | 113113318 | A | 7/2021 |
| CN | 114664761 | A | 6/2022 |
| EP | 3258486 | A1 | 12/2017 |
| EP | 3399548 | A1 | 11/2018 |
| JP | S60160645 | A | 8/1985 |
| JP | 2002217331 | A | 8/2002 |
| JP | 2004172157 | A | 6/2004 |
| JP | 2005026680 | A | 1/2005 |
| JP | 2010212605 | A | 9/2010 |
| JP | 2010278318 | A | 12/2010 |
| JP | 2011233672 | A | 11/2011 |
| KR | 100890073 | * | 3/2009 |
| KR | 20090091486 | A | 8/2009 |
| KR | 20090091487 | A | 8/2009 |
| KR | 20170094483 | A | 8/2017 |
| KR | 20180004658 | A | 1/2018 |
| KR | 20190093194 | A | 8/2019 |
| KR | 20210016216 | A | 2/2021 |
| TW | 200950132 | A | 12/2009 |
| TW | 201128748 | A | 8/2011 |
| TW | 201314812 | A | 4/2013 |
| TW | 201415586 | A | 4/2014 |
| TW | 201532234 | A | 8/2015 |
| TW | 201620102 | A | 6/2016 |
| TW | 202042355 | A | 11/2020 |
| TW | 202044520 | A | 12/2020 |
| TW | 202101685 | A | 1/2021 |
| TW | 202109800 | A | 3/2021 |
| TW | 202121513 | A | 6/2021 |
| TW | 202125725 | A | 7/2021 |
| TW | 202129904 | A | 8/2021 |
| TW | 202209581 | A | 3/2022 |
| TW | M627599 | U | 6/2022 |

OTHER PUBLICATIONS

European office action in application No. 22793375, mailed on Oct. 15, 2025.
US office action in U.S. Appl. No. 18/152,188 mailed on May 20, 2025.
US office action in U.S. Appl. No. 17/951,722 mailed on Jun. 11, 2025.
Singapore Search Report and written opinion in application No. 11202254550S, mailed on Jun. 19, 2025.
Singapore Search Report and written opinion in application No. 11202254069A, mailed on May 23, 2025.
KR first office action in application No. 10-2022-7040844 mailed on Mar. 29, 2024 (with English translation).
KR first office action in application No. 10-2022-7041847 mailed on Mar. 29, 2024 (with English translation).

(56) References Cited

OTHER PUBLICATIONS

JP first office action in application No. 2022-562492, mailed on Sep. 3, 2024.
1 Extended European Search Report in application No. 22790428, mailed on May 22, 2024.
US office action in U.S. Appl. No. 18/166,465, mailed on Oct. 2, 2025.
US Non-final office action in U.S. Appl. No. 17/952,404, mailed on Sep. 23, 2025.
US Non-final office action in U.S. Appl. No. 17/935,068, mailed on Sep. 24, 2025.
JP first office action in application No. 2022-566266, mailed on Oct. 8, 2024.
JP first office action in application No. 2022-563494, mailed on Oct. 1, 2024.
JP office action in application No. 2022-562492, mailed on Apr. 22, 2025.
JP office action in application No. 2022-564372, mailed on Apr. 22, 2025.
JP first office action in application No. 2022-562587, mailed on Oct. 15, 2024.
JP second office action in application No. 2022-562492, mailed on Jan. 7, 2025.
CN first office action in application No. 202210806527.8, mailed on Jul. 31, 2026.

* cited by examiner

SEMICONDUCTOR PACKAGE STRUCTURE AND MANUFACTURING METHOD

CROSS-REFERENCE TO RELATED APPLICATIONS

This is a continuation of International Patent Application No. PCT/CN2022/109430 filed on Aug. 1, 2022, which claims priority to Chinese Patent Application No. 202210806439.8 filed on Jul. 8, 2022. The disclosures of the above-referenced applications are hereby incorporated by reference in their entirety.

BACKGROUND

All sectors, industries and regions continually require lighter, faster, smaller, more functional, more reliable and more cost-effective products for the electronics industry. In order to meet these growing requirements of many different consumers, more circuits are required to be integrated to provide required functions. In almost all applications, there is a growing requirement for reducing dimensions, enhancing performance and improving the functions of the integrated circuits.

SUMMARY

The disclosure relates to the technical field of semiconductors, and in particular, to a semiconductor package structure and a manufacturing method.

In view of this, embodiments of the disclosure provide a semiconductor package structure and a manufacturing method.

A first aspect of an embodiment of the disclosure provides a semiconductor package structure, including:

a first base plate provided with a first surface;

a first chip stack body located on the first base plate, where the first chip stack body includes a plurality of first semiconductor chips that are successively stacked onto one another in a direction perpendicular to the first base plate, and the first chip stack body is electrically connected to the first surface of the first base plate;

an interposer layer located on the first chip stack body, where the interposer layer is provided with a first interconnection surface, the first interconnection surface is provided with a first interconnection region and a second interconnection region, and the first interconnection region is electrically connected to the first base plate; and a molding layer configured to seal the first chip stack body, the interposer layer and the first surface of the first base plate, where the first interconnection region is unsealed by the molding layer, the second interconnection region is sealed by the molding layer, and a first material layer is formed on a sidewall between the first interconnection region and a top surface of the molding layer on the second interconnection region.

A second aspect of an embodiment of the disclosure provides a method for manufacturing a semiconductor package structure, including the following operations.

A first base plate is provided, where the first base plate is provided with a first surface.

A first chip stack body is formed on the first base plate, where the first chip stack body includes a plurality of first semiconductor chips that are successively stacked onto one another in a direction perpendicular to the first base plate, and the first chip stack body is electrically connected to the first surface of the first base plate.

An interposer layer is formed on the first chip stack body, where the interposer layer is provided with a first interconnection surface, the first interconnection surface is provided with a first interconnection region and a second interconnection region, and the first interconnection region is electrically connected to the first base plate.

A molding layer is formed, where the molding layer is configured to seal the first chip stack body, the interposer layer and the first surface of the first base plate. The first interconnection region is unsealed by the molding layer, and the second interconnection region is sealed by the molding layer. There is a preset height between the first interconnection region and a top surface of the molding layer on the second interconnection region. A first material layer is formed on a sidewall between the first interconnection region and the top surface of the molding layer on the second interconnection region.

BRIEF DESCRIPTION OF THE DRAWINGS

In order to more clearly illustrate the technical solutions in the embodiments of the disclosure or conventional technologies, the drawings used in the technical description of the embodiments will be briefly described below. It is apparent that the drawings in the following descriptions are merely some embodiments of the disclosure. Other drawings can be obtained from those skilled in the art according to these drawings without any creative work.

LIST OF REFERENCE NUMERALS

Figure 1:
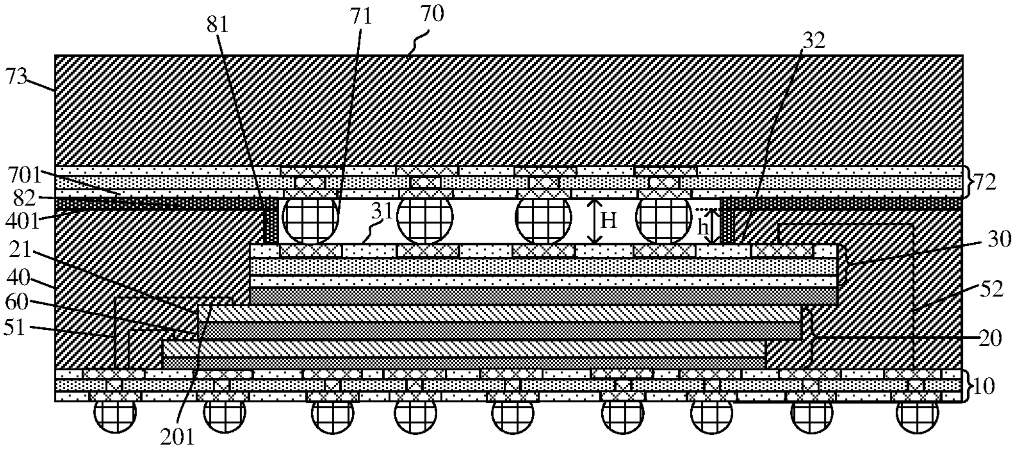
FIG. 1 is a schematic diagram of a semiconductor package structure according to an embodiment of the disclosure.

1—Circular ring; 2—Carrier band;

10—First base plate; 101—First surface; 102—Second surface; 11—Base plate substrate; 12—Base plate upper insulating dielectric layer; 13—Base plate lower insulating dielectric layer; 14—Base plate upper connection pad; 15—Base plate lower connection pad; 16—Base plate connection via; 17—Base plate connection bump; 110—First signal transmission region; 120—Second signal transmission region; 130—Third signal transmission region;

20—First chip stack body; 21—First semiconductor chip; 201—First connection end;

30—Interposer layer; 31—First interconnection region; 32—Second interconnection region; 301—First interconnection surface; 311—First pad; 321—Second pad; 33—Base; 34—Intermediary upper insulating dielectric layer; 35—Intermediary lower insulating dielectric layer;

40—Molding layer; 401—Top surface; 400—Molding layer pre-layer;

51—First conductive wire; 52—Second conductive wire;

60—Adhesive film;

70—Second package structure; 701—Joint face; 71—First solder ball; 72—Second base plate; 73—Second molding layer;

80—Covering layer; 801—First portion; 802—Second portion; 81—First material layer; 82—Second material layer;

91—First packaging mold; 92—Second packaging mold.

DETAILED DESCRIPTION

Exemplary embodiments disclosed in the disclosure are described in more detail with reference to drawings. Although the exemplary embodiments of the disclosure are shown in the drawings, it should be understood that the disclosure may be implemented in various forms and should not be limited by the specific embodiments described here. On the contrary, these embodiments are provided for more thorough understanding of the disclosure, and to fully convey a scope disclosed in the embodiments of the disclosure to a person skilled in the art.

In the following descriptions, a lot of specific details are given in order to provide the more thorough understanding of the disclosure. However, it is apparent to a person skilled in the art that the disclosure may be implemented without one or more of these details. In other examples, in order to avoid confusion with the disclosure, some technical features well-known in the field are not described. Namely, all the features of the actual embodiments are not described here, and well-known functions and structures are not described in detail.

In the drawings, the dimensions of a layer, a region, and an element and their relative dimensions may be exaggerated for clarity. The same reference numeral represents the same element throughout the description.

It should be understood that while the element or the layer is referred to as being "on", "adjacent to", "connected to" or "coupled to" other elements or layers, it may be directly on the other elements or layers, adjacent to, connected or coupled to the other elements or layers, or an intermediate element or layer may be existent. In contrast, while the element is referred to as being "directly on", "directly adjacent to", "directly connected to" or "directly coupled to" other elements or layers, the intermediate element or layer is not existent. It should be understood that although terms first, second, third and the like may be used to describe various elements, components, regions, layers and/or sections, these elements, components, regions, layers and/or sections should not be limited by these terms. These terms are only used to distinguish one element, component, region, layer or section from another element, component, region, layer or section. Therefore, without departing from the teaching of the disclosure, a first element, component, region, layer or section discussed below may be represented as a second element, component, region, layer or section. While the second element, component, region, layer or section is discussed, it does not mean that the first element, component, region, layer or section is necessarily existent in the disclosure.

Spatial relationship terms, such as "under", "below", "lower", "underneath", "above", "upper" and the like, may be used here for conveniently describing so that a relationship between one element or feature shown in the drawings and other elements or features is described. It should be understood that in addition to orientations shown in the drawings, the spatial relationship terms are intended to further include the different orientations of a device in use and operation. For example, if the device in the drawings is turned over, then the elements or the features described as "below" or "underneath" or "under" other elements may be oriented "on" the other elements or features. Therefore, the exemplary terms "below" and "under" may include two orientations of up and down. The device may be otherwise oriented (rotated by 90 degrees or other orientations) and the spatial descriptions used here are interpreted accordingly.

A purpose of the terms used here is only to describe the specific embodiments and not as limitation to the disclosure. While used here, singular forms of "a", "an" and "said/the" are also intended to include plural forms, unless the context clearly indicates otherwise. It should also be understood that terms "composition" and/or "including", while used in the description, determine the existence of the described features, integers, steps, operations, elements and/or components, but do not exclude the existence or addition of one or more other features, integers, steps, operations, elements, components, and/or groups. As used herein, a term "and/or" includes any and all combinations of related items listed.

In order to understand the disclosure thoroughly, detailed operations and detailed structures are presented in the following description, so as to explain the technical solutions of the disclosure. Preferred embodiments of the disclosure are described in detail below. However, the disclosure may also have other implementations in addition to these detailed descriptions.

An embodiment of the disclosure provides a semiconductor package structure. FIG. 1 is a schematic diagram of a semiconductor package structure according to an embodiment of the disclosure.

Figure 2:
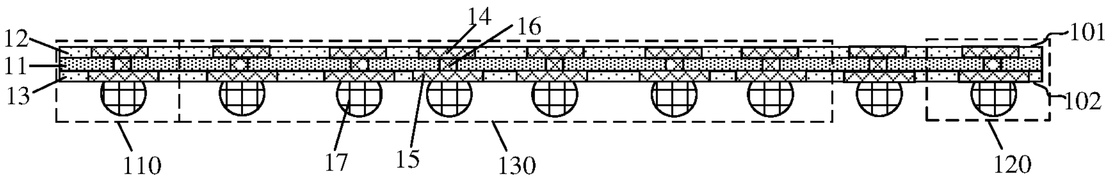
FIG. 2 is a schematic diagram of a first base plate according to an embodiment of the disclosure.

With reference to FIG. 1 and FIG. 2, the semiconductor package structure includes:

a first base plate 10 provided with a first surface 101;

a first chip stack body 20 located on the first base plate 10, where the first chip stack body 20 includes a plurality of first semiconductor chips 21 that are successively stacked onto one another in a direction perpendicular to the first base plate 10, and the first chip stack body 20 is electrically connected to the first surface 101 of the first base plate 10;

an interposer layer 30 located on the first chip body 20, where the interposer layer 30 is provided with a first interconnection surface 301, the first interconnection surface 301 is provided with a first interconnection region 31 and a second interconnection region 32, and the first interconnection region 31 is electrically connected to the first base plate 10; and a molding layer 40 configured to seal the first chip stack body 20, the interposer layer 30 and the first surface 101 of the first base plate 10, where the first interconnection region 31 is unsealed by the molding layer 40, the second interconnection region 32 is sealed by the molding layer 40, a first material layer 81 is formed on a sidewall between the first interconnection region 31 and a top surface 401 of the molding layer 40 on the second interconnection region 32.

In the embodiments of the disclosure, through the arrangement of the interposer layer, the subsequent second package structure may be connected to the first chip stack body and the first base plate by means of the first interconnection region on the interposer layer. Therefore, the interconnection among the chip structures with different types or different specifications can be realized, so as to cause a combination among different chip structures to be more flexible. In addition, since the first chip stack body and the subsequent second package structure connected to the first chip stack body are packaged independently, it is easier to perform test and failure analysis. In addition, the first material layer is formed on the sidewall between the top surface of the molding layer and the first interconnection region, so that a region where the interposer layer is in contact with the subsequent second package structure connected to the interposer layer can be protected.

FIG. 2 is a schematic diagram of a first base plate according to an embodiment of the disclosure.

In some embodiments, the first base plate 10 may be a Printed Circuit Board (PCB) or a redistribution base plate.

As shown in FIG. 2, the first base plate 10 includes a base plate substrate 11, a base plate upper insulating dielectric layer 12 disposed on an upper surface of the base plate substrate 11, and a base plate lower insulating dielectric layer 13 disposed on a lower surface of the base plate substrate 11.

The base plate substrate 11 may be a silicon substrate, a germanium substrate, a silicon germanium substrate, a silicon carbide substrate, a Silicon On Insulator (SOI) substrate, or a Germanium On Insulator (GOI) substrate, or may be a substrate including other element semiconductors or compound semiconductors, such as a glass substrate or a III-V compound substrates (for example, a gallium nitride substrate or a gallium arsenide substrate), or may be a stack of layer structures such as Si/SiGe, or may be other epitaxial structures such as Silicon Germanium On Insulator (SGOI).

Each of the base plate upper insulating dielectric layer 12 and the base plate lower insulating dielectric layer 13 may be a solder mask layer. For example, each of the material of the base plate upper insulating dielectric layer 12 and the material of the base plate lower insulating dielectric layer 13 may be green paint.

In this embodiment of the disclosure, the first surface 101 of the first base plate 10 is an upper surface of the base plate upper insulating dielectric layer 12. The first base plate 10 further includes a second surface 102, that is, a lower surface of the base plate lower insulating dielectric layer 13.

The first base plate 10 further includes a base plate upper connection pad 14 located in the base plate upper insulating dielectric layer 12, a base plate lower connection pad 15 located in the base plate lower insulating dielectric layer 13, and a base plate connection via 16 which penetrates through the base plate substrate 11 and which connects the base plate upper connection pad 14 and the base plate lower connection pad 15 with each other.

Each of the material of the base plate upper connection pad 14 and the material of the base plate lower connection pad 15 may include at least one of aluminum, copper, nickel, tungsten, platinum, or gold. The base plate connection via 16 may be a Through-Silicon-Via (TSV).

The first base plate 10 further includes a base plate connection bump 17. The base plate connection bump 17 may electrically connect the semiconductor package structure to an external apparatus, so that at least one of a control signal, a power signal or a grounding signal that is configured to operate the first chip stack body may be received from the external apparatus, or a data signal to be stored in the first chip stack body may be received from the external apparatus, or data in the first chip stack body may also be provided to the external apparatus.

The base plate connection bump 17 includes a conductive material. In the embodiment of the disclosure, the base plate connection bump 17 is a solder ball. It is to be understood that a shape of the base plate connection bump provided in this embodiment of the disclosure is only an inferior and feasible specific implementation in the embodiments of the disclosure, and does not constitute a limitation of the disclosure. The base plate connection bump may also be a structure with other shapes. The number, spacing, and location of the base plate connection bumps are not limited to any specific arrangement, and various modifications may be made.

Continuously with reference to FIG. 2, the first base plate 10 further includes a first signal transmission region 110 located on one side of the first base plate 10, and a second signal transmission region 120 located on another side of the first base plate 10 opposite to the one side. The first signal transmission region 110 is electrically connected to the first chip stack body 20. The second signal transmission region 120 is electrically connected to the interposer layer 30.

The first base plate 10 further includes a third signal transmission region 130 located between the first signal transmission region 110 and the second signal transmission region 120. The first chip stack body 20 is located on the third signal transmission region 130.

Continuously with reference to FIG. 1, the first chip stack body 20 includes a plurality of first semiconductor chips 21 that are successively stacked onto one another in a direction perpendicular to the first base plate 10. In this embodiment, by means of successively stacking the plurality of first semiconductor chips onto one another upwards, a horizontal area of the semiconductor package structure can be saved.

In an embodiment of the disclosure, each of the plurality of first semiconductor chips may be a DRAM chip.

Figure 3:
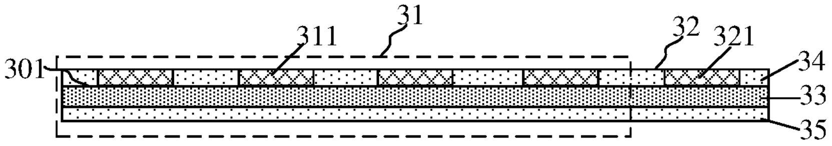
FIG. 3 is a schematic diagram of an interposer layer according to an embodiment of the disclosure.

FIG. 3 is a schematic diagram of an interposer layer according to an embodiment of the disclosure.

As shown in FIG. 3, the interposer layer 30 includes a base 33, an intermediary upper insulating dielectric layer 34 disposed on an upper surface of the base 33, and an intermediary lower insulating dielectric layer 35 disposed on a lower surface of the base 33.

The base 33 may be a silicon substrate, a germanium substrate, a silicon germanium substrate, a silicon carbide substrate, an SOI substrate, or a GOI substrate, or may be a substrate including other element semiconductors or compound semiconductors, such as a glass substrate or a III-V compound substrates (for example, a gallium nitride substrate or a gallium arsenide substrate), or may be a stack of layer structures such as Si/SiGe, or may be other epitaxial structures such as SGOI.

Each of the intermediary upper insulating dielectric layer 34 and the intermediary lower insulating dielectric layer 35 may be a solder mask layer. For example, each of the material of the intermediary upper insulating dielectric layer 34 and the material of the intermediary lower insulating dielectric layer 35 may be green paint.

In an embodiment, an electromagnetic shielding layer (not shown) is provided in the base 33 of the interposer layer 30. By disposing the electromagnetic shielding layer in the base of the interposer layer, information interference between the second package structure and the first chip stack body can be prevented, thereby preventing the operation of devices from being affected.

The interposer layer 30 includes a first interconnection region 31 and a second interconnection region 32. The first interconnection region 31 includes a plurality of first pads 311, and the second interconnection region 32 includes a plurality of second pads 321. The number of the plurality of second pads 321 is greater than the number of the plurality of first pads 311, and an area of each of the plurality of second pads 321 is less than an area of each of the plurality of first pads 311.

Since the plurality of first pads need to be matched with and connected to the second package structure subsequently, the layout design is relatively fixed. The plurality of first pads carry the interconnection between the second package structure and the first base plate, so that the layout design is more flexible. The signal transmission efficiency can be enhanced by designing the plurality of second pads to have a large number and a smaller area.

Each of the material of the plurality of first pads 311 and the material of the plurality of second pads 321 may include at least one of aluminum, copper, nickel, tungsten, platinum, or gold.

In an embodiment, in the direction perpendicular to the first base plate 10, the first base plate 10 has a first thickness, and the interposer layer 30 has a second thickness, where the first thickness is greater than the second thickness.

Continuously with reference to FIG. 1, the semiconductor package structure further includes: a plurality of first conductive wires 51, where each of the plurality of first semiconductor chips 21 is electrically connected to the first base plate 10 by means of a respective one of the plurality of first conductive wires 51; and a second conductive wire 52, where the second interconnection region 32 is electrically connected to the first base plate 10 by means of the plurality of second conductive wires 52.

Specifically, each of the plurality of first semiconductor chips 21 is provided with a first connection end 201. The first connection end 201 and the first signal transmission region 110 are located on the same side. Each of the plurality of first conductive wires 51 extends from the first connection end 201 to the first signal transmission region 110, to achieve an electric connection between the plurality of first semiconductor chips 21 and the first base plate 10.

The plurality of second pads 321 are formed on the second interconnection region 32. The plurality of second conductive wires 52 extend from the plurality of second pads 321 to the second signal transmission region 120, to achieve an electric connection between the interposer layer 30 and the first base plate 10.

In this embodiment of the disclosure, the first chip stack body is electrically connected to the first base plate by means of wire bonding. The wire bonding includes an overhang manner and a Film on Wire (FOW) manner.

In the embodiment shown in FIG. 1, wire bonding is performed by means of the overhang manner. Any two adjacent first semiconductor chips 21 of the plurality of first semiconductor chips 21 are connected to each other by means of an adhesive film 60. The adhesive film 60 does not cover the first connection end 201 and a respective one of the plurality of first conductive wires 51 on a respective one of the plurality of first semiconductor chips 21 located below the adhesive film 60. The adhesive film 60 is misaligned with the respective one of the plurality of first semiconductor chips 21 located below the adhesive film 60.

In some other embodiments, wire bonding is performed by means of the FOW manner (not shown). The plurality of first semiconductor chips are aligned with each other along a direction perpendicular to the first base plate. The adhesive film between two adjacent first semiconductor chips of the plurality of first semiconductor chips covers the first connection end and a respective one of the plurality of first conductive wires on a respective one of the plurality of first semiconductor chips located below the adhesive film.

It is to be understood that in this embodiment of the disclosure, the electric connection by means of lead wires is only an inferior and feasible specific implementation in the embodiments of the disclosure, and does not constitute a limitation of the disclosure. The electric connection may also be achieved by means of other manners, for example, hybrid bonding or bump interconnection.

In an embodiment, the sidewall between the top surface 401 of the molding layer 40 and the first interconnection region 31 forms a first angle with the direction perpendicular to the first base plate 10. The first angle is greater than or equal to 0° and less than 90°.

For example, in the embodiment shown in FIG. 1, the sidewall between the top surface 401 of the molding layer 40 and the first interconnection region 31 forms an angle with the direction perpendicular to the first base plate 10, where the angle is 0°. That is, the sidewall between the top surface 401 of the molding layer 40 and the first interconnection region 31 is perpendicular to the first base plate 10. A simpler process can be achieved by setting the sidewall of the molding layer to be vertical.

Figure 4A:
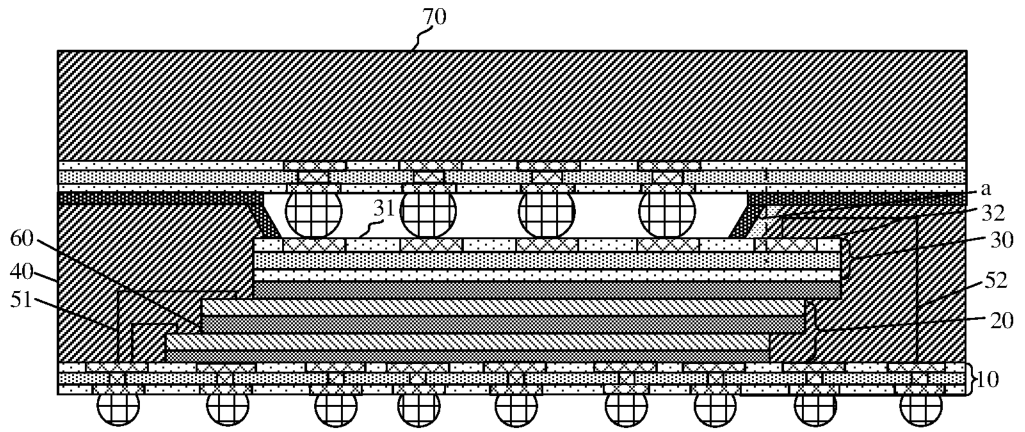
FIG. 4A is another example of a semiconductor package structure according to an embodiment of the disclosure.

In the embodiment shown in FIG. 4A, the sidewall between the top surface 401 of the molding layer 40 and the first interconnection region 31 forms an angle a with the direction perpendicular to the first base plate 10, where the angle a is greater than 0° and less than 90°. The subsequent interconnection of the molding layer with the second package structure can be more convenient by setting the sidewall of the molding layer to be non-vertical.

In an embodiment, a material of the first material layer 81 includes a conductive material or an insulation material. When the material of the first material layer is a conductive material, electrostatic protection can be achieved; and when the material of the first material layer is an insulation material, insulation isolation can be achieved.

In an embodiment, the semiconductor package structure further includes a second material layer 82 located on the top surface 401 of the molding layer 40. A material of the second material layer 82 is the same as the material of the first material layer 81.

The second material layer is located between the molding layer and the second package structure, so that the sealing between the first chip stack body and the second package structure can be achieved, a joint surface between the molding layer and the second package structure can also be protected, and external moisture and electromagnetic interference can also be prevented.

In an embodiment, when each of the first material layer 81 and the second material layer 82 is made of a conductive material, a heat conduction channel from the periphery of the first interconnection region 31 on the interposer layer to the molding layer 40 may be formed, so that the thermal performance of the product can be improved. Specifically, the first material layer 81 and the second material layer 82 may be made of copper, tin or copper-tin alloy, or the like.

In an embodiment, when each of the first material layer 81 and the second material layer 82 is made of an insulation material, a sealed protection ring may be formed from the periphery of the first interconnection region 31 on the interposer layer to the molding layer 40, so that the structural stability of the product can be improved. Specifically, the first material layer 81 and the second material layer 82 may be a silicon oxide layer, a silicon nitride layer or a silicon oxynitride layer.

In an embodiment, the first material layer 81 may be made of copper, tin or copper-tin alloy, or the like, and the second material layer 82 may be made of silicon dioxide.

In an embodiment, the first material layer 81 may be made of silicon dioxide, and the second material layer 82 may be made of copper, tin or copper-tin alloy, or the like.

In an embodiment, the semiconductor package structure further includes a second package structure 70. The second package structure 70 includes a plurality of first solder balls 71. The plurality of first solder balls 71 are electrically connected to the first interconnection region 31. There is a preset height h between the first interconnection region 31 and the top surface 401 of the molding layer 40 on the second interconnection region 32. A height H of each of the plurality of first solder balls 71 is greater than the preset height h.

In this embodiment of the disclosure, by setting the height of each of the plurality of first solder balls to be greater than the height between the first interconnection region and the top surface of the molding layer, the second package structure can be tightly connected to the interposer layer. In addition, after the second package structure is connected to the interposer layer, there may be a gap between the second package structure and the molding layer. Therefore, the heat dissipation efficiency of a controller can be enhanced, and the impact of heat on chips can be reduced.

The second package structure 70 further includes a second base plate 72. A structure of the second base plate 72 may be the same as or different from a structure of the base plate 10, which is not described herein again.

In this embodiment of the disclosure, the second package structure 70 further includes a joint face 701. The plurality of first solder balls 71 are located on the joint face 701, penetrate through the joint face 701 and are electrically connected to the second base plate 72.

In this embodiment of the disclosure, as shown in FIG. 1, a material of the joint face 701 may be silicon dioxide. When the material of the joint face 701 is silicon dioxide, the second material layer 82 on the molding layer 40 is a silicon dioxide layer. Through such an arrangement, when the plurality of first solder balls 71 are bonded to the plurality of first pads 311, the molding layer 40 is bonded to the second package structure 70 by means of the second material layer 82.

Figure 4B:
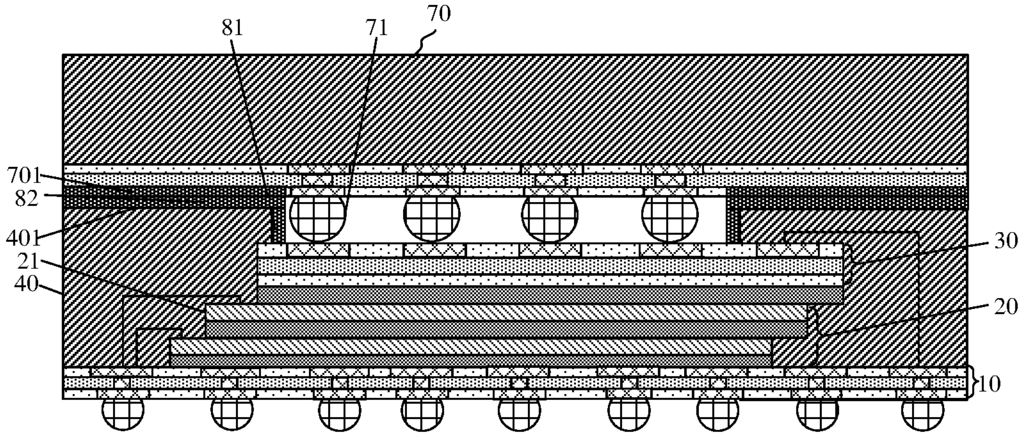
FIG. 4B is yet another example of a semiconductor package structure according to an embodiment of the disclosure.

In this embodiment of the disclosure, as shown in FIG. 4B, the second material layer 82 may be a copper layer, a tin layer, or a copper-tin layer. When the second material layer 82 may be a copper layer, a tin layer, or a copper-tin layer, a position on the joint face 701 corresponding to the second material layer 82 is provided with a copper layer, a tin layer, or a copper-tin layer. When the plurality of first solder balls 71 are bonded to the plurality of first pads 311, the molding layer 40 is bonded to the second package structure 70 by means of the second material layer 82.

In an embodiment, in the direction perpendicular to the first base plate 10, the molding layer 40 has a first thickness. The second package structure 70 includes a second molding layer 73. In the direction perpendicular to the first base plate 10, the second molding layer 73 has a second thickness. The first thickness is greater than or equal to the second thickness. Through the arrangement of such thickness, the second package structure may be effectively prevented from warping after being bonded to the interposer layer.

The second package structure 70 further includes a second semiconductor chip structure (not shown). The type of the second semiconductor chip structure is the same as or different from the type of the first chip stack body 20. The second semiconductor chip structure in the second package structure 70 is electrically connected to the second base plate 72.

For example, the second semiconductor chip structure may be a Universal File Store (UFS) chip.

The semiconductor package structure provided in the embodiments of the disclosure is applicable to UFS Multi Chip Package (UMCP) of a Package on Package (PoP) structure.

Figure 5:
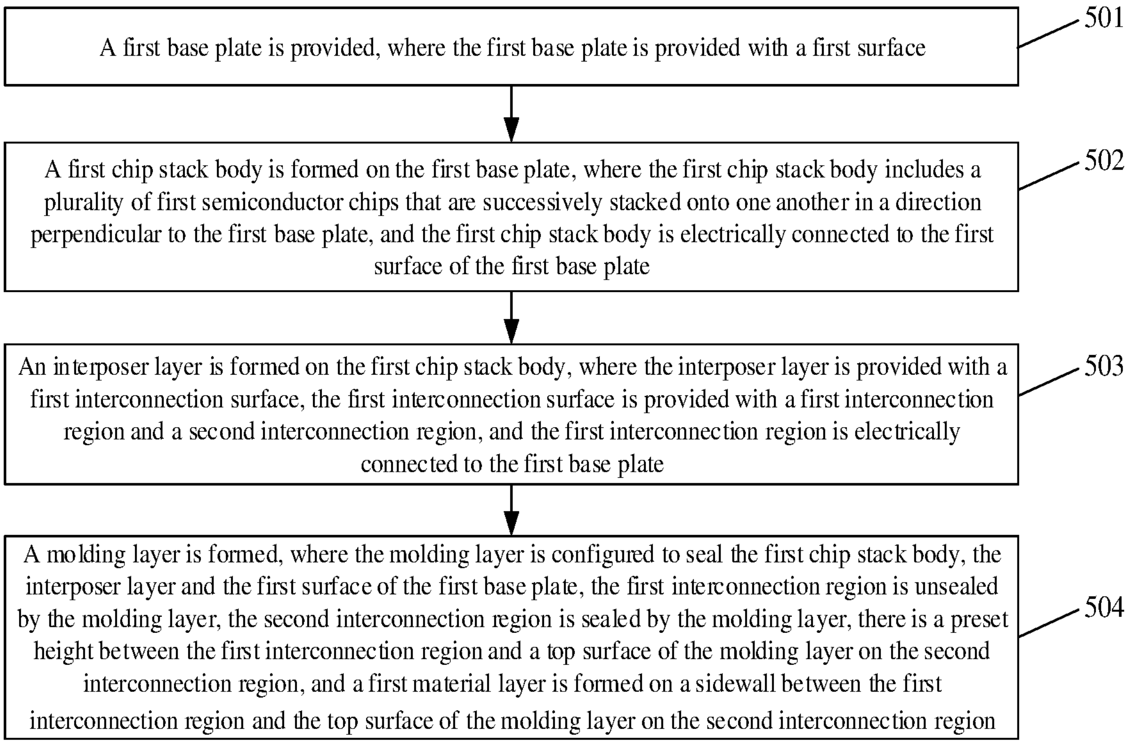
FIG. 5 is a schematic flowchart of a method for manufacturing a semiconductor package structure according to an embodiment of the disclosure.

An embodiment of the disclosure further provides a method for manufacturing a semiconductor package structure. With reference to FIG. 5 for details, as shown in the figure, the method includes the following operations.

At S501, a first base plate is provided, where the first base plate is provided with a first surface.

At S502, a first chip stack body is formed on the first base plate, where the first chip stack body includes a plurality of first semiconductor chips that are successively stacked onto one another in a direction perpendicular to the first base plate, and the first chip stack body is electrically connected to the first surface of the first base plate.

At S503, an interposer layer is formed on the first chip stack body, where the interposer layer is provided with a first interconnection surface, the first interconnection surface is provided with a first interconnection region and a second interconnection region, and the first interconnection region is electrically connected to the first base plate.

At S504, a molding layer is formed, where the molding layer is configured to seal the first chip stack body, the interposer layer and the first surface of the first base plate, the first interconnection region is unsealed by the molding layer, the second interconnection region is sealed by the molding layer, there is a preset height between the first interconnection region and a top surface of the molding layer on the second interconnection region, and a first material layer is formed on a sidewall between the first interconnection region and the top surface of the molding layer on the second interconnection region.

The method for manufacturing the semiconductor package structure provided in the embodiments of the disclosure is further described in detail below with reference to specific embodiments.

FIG. 6A to FIG. 6I are schematic diagrams of a semiconductor package structure during manufacturing according to an embodiment of the disclosure.

Figure 6A:
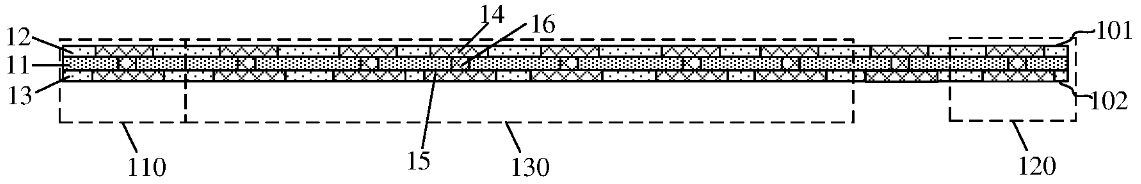
FIG. 6A is a first schematic diagram of a device structure of a semiconductor package structure during manufacturing according to an embodiment of the disclosure.

First with reference to FIG. 6A, S501 is executed. At S501, a first base plate 10 is provided, where the first base plate 10 is provided with a first surface 101.

In some embodiments, the first base plate 10 may be a Printed Circuit Board (PCB) or a redistribution base plate.

As shown in FIG. 2, the first base plate 10 includes a base plate substrate 11, a base plate upper insulating dielectric layer 12 disposed on an upper surface of the base plate substrate 11, and a base plate lower insulating dielectric layer 13 disposed on a lower surface of the base plate substrate 11.

The base plate substrate 11 may be a silicon substrate, a germanium substrate, a silicon germanium substrate, a silicon carbide substrate, an SOI substrate, or a GOI substrate, or may be a substrate including other element semiconductors or compound semiconductors, such as a glass substrate or a III-V compound substrates (for example, a gallium nitride substrate or a gallium arsenide substrate), or may be a stack of layer structures such as Si/SiGe, or may be other epitaxial structures such as SGOI.

Each of the base plate upper insulating dielectric layer 12 and the base plate lower insulating dielectric layer 13 may be a solder mask layer. For example, each of the material of the base plate upper insulating dielectric layer 12 and the material of the base plate lower insulating dielectric layer 13 may be green paint.

In this embodiment of the disclosure, the first surface 101 of the first base plate 10 is an upper surface of the base plate upper insulating dielectric layer 12. The first base plate 10 further includes a second surface 102, that is, a lower surface of the base plate lower insulating dielectric layer 13.

The first base plate 10 further includes a base plate upper connection pad 14 located in the base plate upper insulating dielectric layer 12, a base plate lower connection pad 15 located in the base plate lower insulating dielectric layer 13, and a base plate connection via 16 which penetrates through the base plate substrate 11 and which connects the base plate upper connection pad 14 and the base plate lower connection pad 15 with each other.

Each of the material of the base plate upper connection pad 14 and the material of the base plate lower connection pad 15 may include at least one of aluminum, copper, nickel, tungsten, platinum, or gold. The base plate connection via 16 may be a Through-Silicon-Via (TSV).

The first base plate 10 further includes a first signal transmission region 110 located on one side of the first base plate 10, and a second signal transmission region 120 located on another side of the first base plate 10 opposite to the one side. The first signal transmission region 110 is electrically connected to a first chip stack body formed subsequently. The second signal transmission region 120 is electrically connected to an interposer layer formed subsequently.

In some embodiments, the first signal transmission region 110 and the second signal transmission region 120 are not connected to each other.

The first base plate 10 further includes a third signal transmission region 130 located between the first signal transmission region 110 and the second signal transmission region 120. The first chip stack body formed subsequently is located on the third signal transmission region 130.

In some embodiments, the first signal transmission region 110 and the third signal transmission region 130 are connected to each other, and the third signal transmission region 130 and the second signal transmission region 120 are not connected to each other.

Figure 6B:
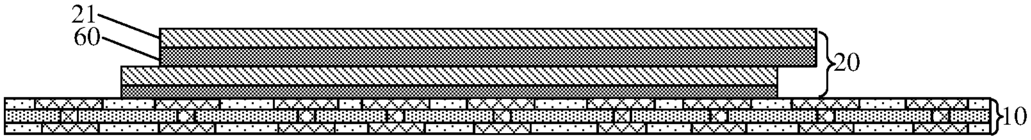
FIG. 6B is a second schematic diagram of a device structure of a semiconductor package structure during manufacturing according to an embodiment of the disclosure.

Next, with reference to FIG. 6B, S502 is executed. At S502, a first chip stack body 20 is formed on the first base plate 10. The first chip stack body 20 includes a plurality of first semiconductor chips 21 that are successively stacked onto one another in a direction perpendicular to the first base plate 10, and the first chip stack body 20 is electrically connected to the first surface 101 of the first base plate 10.

In this embodiment of the disclosure, by means of successively stacking the plurality of first semiconductor chips onto one another upwards, a horizontal area of the semiconductor package structure can be saved.

Any two adjacent first semiconductor chips 21 of the plurality of first semiconductor chips 21 are connected to each other by means of an adhesive film 60. The first chip stack body 20 is connected to the first base plate 10 by means of an adhesive film 60.

Figure 6C:
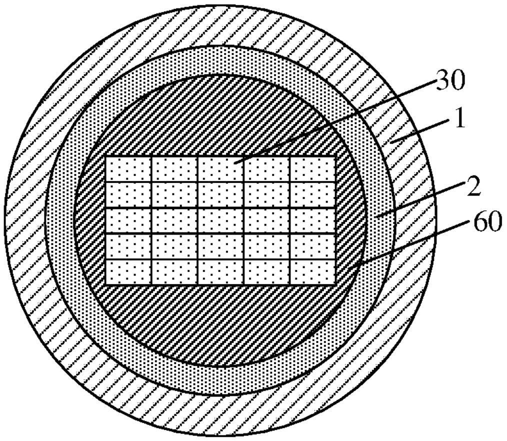
FIG. 6C is a third schematic diagram of a device structure of a semiconductor package structure during manufacturing according to an embodiment of the disclosure.
Figure 6D:
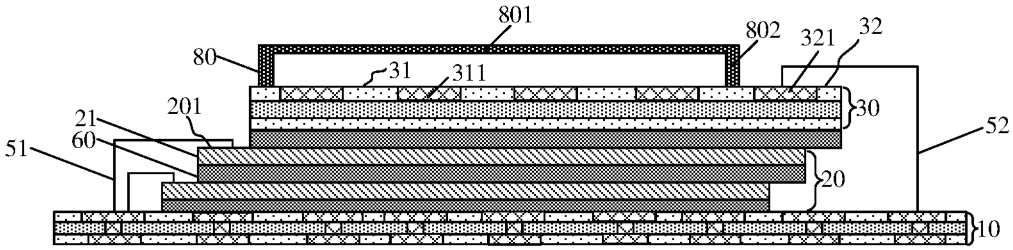
FIG. 6D is a fourth schematic diagram of a device structure of a semiconductor package structure during manufacturing according to an embodiment of the disclosure.

Next, with reference to FIG. 6C to FIG. 6D, S503 is executed. At S503, an interposer layer 30 is formed on the first chip stack body 20. The interposer layer 30 is provided with a first interconnection surface 301. The first interconnection surface 301 is provided with a first interconnection region 31 and a second interconnection region 32. The first interconnection region 31 is electrically connected to the first base plate 10.

Specifically, with reference to FIG. 6C first, a carrier band 2 is pasted on a circular ring 1. An adhesive film 60 is then pasted on the carrier band 2. Then, the interposer layer is pasted on the adhesive film 60. In this case, the interposer layer is in a whole strip shape. The interposer layer is cut to form units one by one shown in FIG. 6C.

Next, with reference to FIG. 6D, the interposer layer 30 is formed on the first chip stack body 20.

Specifically, an adhesive layer 60 is formed on the first chip stack body 20. Then, the single interposer layer 30 formed in FIG. 6C is pasted on the adhesive layer 60.

As shown in FIG. 3, the interposer layer 30 includes a base 33, an intermediary upper insulating dielectric layer 34 disposed on an upper surface of the base 33, and an intermediary lower insulating dielectric layer 35 disposed on a lower surface of the base 33.

The base 33 may be a silicon substrate, a germanium substrate, a silicon germanium substrate, a silicon carbide substrate, an SOI substrate, or a GOI substrate, or may be a substrate including other element semiconductors or compound semiconductors, such as a glass substrate or a III-V compound substrates (for example, a gallium nitride substrate or a gallium arsenide substrate), or may be a stack of layer structures such as Si/SiGe, or may be other epitaxial structures such as SGOI.

Each of the intermediary upper insulating dielectric layer 34 and the intermediary lower insulating dielectric layer 35 may be a solder mask layer. For example, each of the material of the intermediary upper insulating dielectric layer 34 and the material of the intermediary lower insulating dielectric layer 35 may be green paint.

In an embodiment, an electromagnetic shielding layer (not shown) is provided in the base 33 of the interposer layer 30. By disposing the electromagnetic shielding layer in the base of the interposer layer, information interference between the second package structure and the first chip stack body can be prevented, thereby preventing the operation of devices from being affected.

In an embodiment, the method further includes the following operations. A plurality of first pads 311 are formed on the first interconnection region 31, and a plurality of second pads 321 are formed on the second interconnection region 32. The number of the plurality of second pads 321 is greater than the number of the plurality of first pads 311. An area of each of the plurality of second pads 321 is less than an area of each of the plurality of first pads 311.

Since the plurality of first pads need to be matched with and connected to the second package structure subsequently, the layout design is relatively fixed. The plurality of first pads carry the interconnection between the second package structure and the first base plate, so that the layout design is more flexible. The signal transmission efficiency can be enhanced by designing the plurality of second pads to have a large number and a smaller area.

Each of the material of the plurality of first pads 311 and the material of the plurality of second pads 321 may include at least one of aluminum, copper, nickel, tungsten, platinum, or gold.

In an embodiment, in the direction perpendicular to the first base plate 10, the first base plate 10 has a first thickness, and the interposer layer 30 has a second thickness, where the first thickness is greater than the second thickness.

Next, with reference to FIG. 6D, after the interposer layer 30 is formed, a covering layer 80 is formed on the first interconnection region 31 of the interposer layer 30. The covering layer 80 includes a first portion 801 and second portions 802 located on two sides of the first portion 801. The first portion 801 and the second portions 802 form an inverted U-shape, to form a sealed cavity with the interposer layer 30. An angle between each of the second portions 802 and the direction perpendicular to the first base plate 10 is a first angle, where the first angle is greater than or equal to 0° and less than 90°.

In the embodiment shown in FIG. 6D, the angle between each of the second portions 802 of the covering layer 80 and the direction perpendicular to the first base plate 10 is 0°. A structure of the formed molding layer is shown in FIG. 1. In other embodiments, the angle between each of the second portions of the covering layer and the direction perpendicular to the first base plate is greater than 0° and less than 90°. The structure of the formed molding layer is shown in FIG. 4A.

In this embodiment of the disclosure, the covering layer is formed on the first interconnection region of the interposer layer, so that after the molding layer is formed subsequently, the first interconnection region is exposed without using a special-shaped packaging mold, but the first interconnection region may be directly exposed by removing the first portion of the covering layer. The special-shaped packaging mold is high in manufacturing cost and more complicated in process. Therefore, by forming the covering layer on the first interconnection region, the cost can be reduced, and a formation process can be simpler as well.

In an embodiment, a material of the covering layer 80 includes a conductive material or an insulation material.

After the covering layer 80 is formed, the interposer layer attached to the circular ring 1 is required to be cleaned to remove impurities and dust, to prevent the interposer layer from being dirty and affecting the performance of the semiconductor package structure.

Next, after the interposer layer 30 is formed, a plurality of first conductive wires 51 are formed, where each of the plurality of first semiconductor chips 21 is electrically connected to the first base plate 10 by means of a respective one of the plurality of first conductive wires 51; and a plurality of second conductive wires 52 are formed, where the second interconnection region 32 is electrically connected to the first base plate 10 by means of the plurality of second conductive wires 52.

Specifically, each of the plurality of the first semiconductor chips 21 is provided with a first connection end 201. The first connection end 201 and the first signal transmission region 110 are located on the same side. Each of the plurality of first conductive wires 51 extends from the first connection end 201 to the first signal transmission region 110, to achieve an electric connection between the plurality of first semiconductor chips 21 and the first base plate 10.

The plurality of second pads 321 are formed on the second interconnection region 32. The plurality of second conductive wires 52 extend from the plurality of second pads 321 to the second signal transmission region 120, to achieve an electric connection between the interposer layer 30 and the first base plate 10.

In this embodiment of the disclosure, the first chip stack body is electrically connected to the first base plate by means of wire bonding. The wire bonding includes an overhang manner and a Film on Wire (FOW) manner.

In the embodiment shown in FIG. 6D, wire bonding is performed by means of the overhang manner. Any two adjacent first semiconductor chips 21 of the plurality of first semiconductor chips 21 are connected to each other by means of an adhesive film 60. The adhesive film 60 does not cover the first connection end 201 and a respective one of the plurality of first conductive wires 51 on a respective one of the plurality of first semiconductor chips 21 located below the adhesive film 60. The adhesive film 60 is misaligned with the respective one of the plurality of first semiconductor chips 21 located below the adhesive film 60.

In some other embodiments, wire bonding is performed by means of the FOW manner (not shown). The plurality of first semiconductor chips are aligned with each other along a direction perpendicular to the first base plate. The adhesive film between two adjacent first semiconductor chips of the plurality of first semiconductor chips covers the first connection end and a respective one of the plurality of first conductive wires on a respective one of the plurality of first semiconductor chips located below the adhesive film.

Figure 6E:
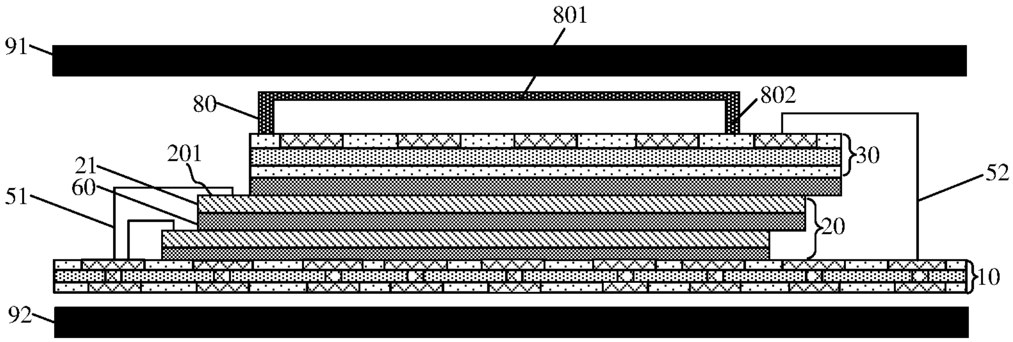
FIG. 6E is a fifth schematic diagram of a device structure of a semiconductor package structure during manufacturing according to an embodiment of the disclosure.
Figure 6F:
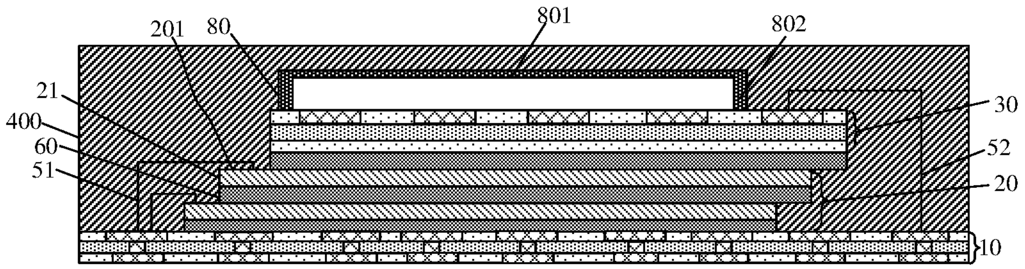
FIG. 6F is a sixth schematic diagram of a device structure of a semiconductor package structure during manufacturing according to an embodiment of the disclosure.
Figure 6G:
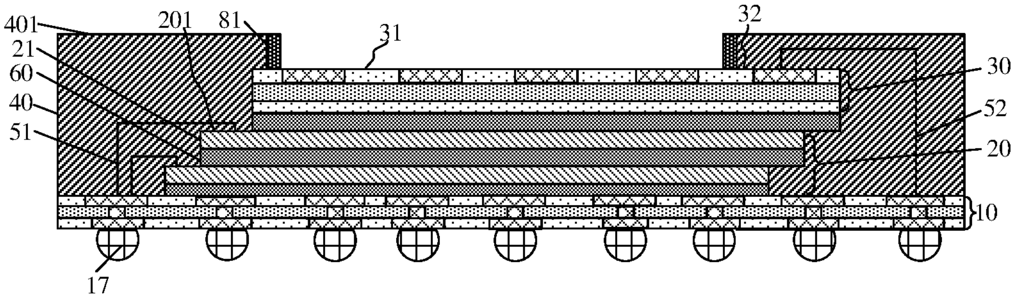
FIG. 6G is a seventh schematic diagram of a device structure of a semiconductor package structure during manufacturing according to an embodiment of the disclosure.

Next, with reference to FIG. 6E to FIG. 6G, S504 is executed. At S504, a molding layer 40 is formed, where the molding layer 40 is configured to seal the first chip stack body 20, the interposer layer 30 and the first surface 101 of the first base plate 10. The first interconnection region 31 is unsealed by the molding layer 40, and the second interconnection region 32 is sealed by the molding layer 40. There is a preset height h between the first interconnection region 31 and the top surface 401 of the molding layer 40 on the second interconnection region 32. A first material layer 81 is formed on a sidewall between the first interconnection region 31 and the top surface 401 of the molding layer 40 on the second interconnection region 32.

Specifically, with reference to FIG. 6E first, after the covering layer 80 is formed, a first packaging mold 91 and a second packaging mold 92 are formed. A surface of the first packaging mold 91 is parallel to a surface of the first base plate 10. The first packaging mold 91 is located above the covering layer 80 and is located at a certain distance from the covering layer 80. The second packaging mold 92 is located below the first base plate 10, and is parallel to the surface of the first base plate 10.

Next, with reference to FIG. 6F, the method further includes the following operation. A molding layer pre-layer 400, which is configured to seal the first chip stack body 20, the interposer layer 30, the covering layer 80 and the first surface 101 of the first base plate 10, is formed by using the first packaging mold 91 and the second packaging mold 92 as masks.

In an embodiment, the molding layer pre-layer 400 includes an EMC material.

After the molding layer pre-layer 400 is formed, the first packaging mold 91 and the second packaging mold 92 are removed.

Next, with reference to FIG. 6G, a part of the molding layer pre-layer 400 and the first portion 801 of the covering layer 80 are removed, where the second portions 802 are retained to form the first material layer 81.

Specifically, the surface of the molding layer pre-layer 400 may be ground by using a grinding process, to remove a part of the molding layer pre-layer 400 and the first portion 801 of the covering layer 80.

Continuously with reference to FIG. 6G, after the molding layer 40 is formed, a base plate connection bump 17 is formed on the second surface 102 of the first base plate 10. The base plate connection bump 17 includes a conductive material.

Figure 6H:
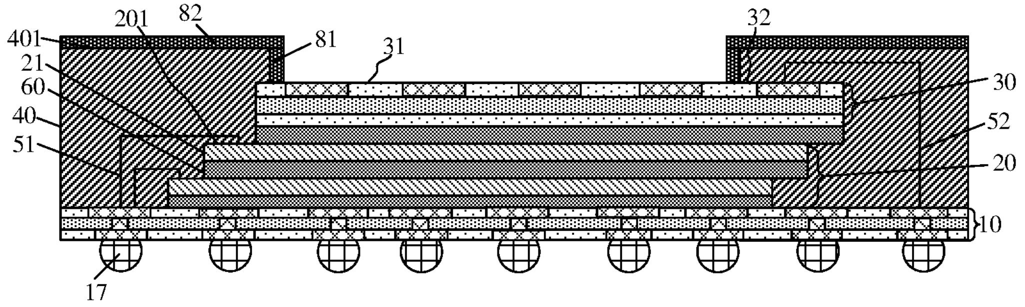
FIG. 6H is an eighth schematic diagram of a device structure of a semiconductor package structure during manufacturing according to an embodiment of the disclosure.

Next, with reference to FIG. 6H, the method further includes the following operation. After the molding layer 40 is formed, a second material layer 82 is formed on the top surface 401 of the molding layer 40. A material of the second material layer 82 is the same as a material of the first material layer 81.

Specifically, a second material layer pre-layer (not shown) may be formed on the top surface 401 of the molding layer 40 and a surface of the interposer layer 30. Then, the second material layer pre-layer on the surface of the interposer layer 30 is removed, where the second material layer pre-layer on the top surface 401 of the molding layer 40 is retained, to form the second material layer 82.

Figure 6I:
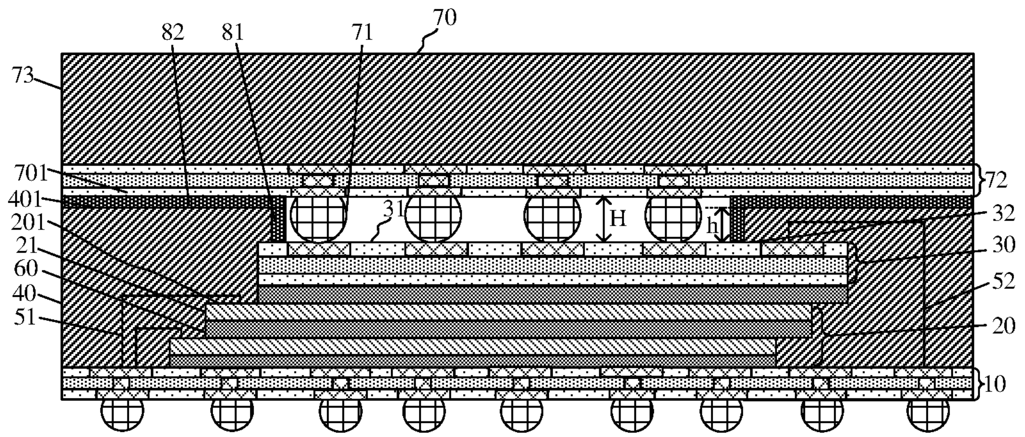
FIG. 6I is a ninth schematic diagram of a device structure of a semiconductor package structure during manufacturing according to an embodiment of the disclosure.

Next, with reference to FIG. 6I, the method further includes the following operations. A second package structure 70 is formed, where the second package structure 70 includes a joint face 701 and a plurality of first solder balls 71 located on the joint face 701. The plurality of first solder balls 71 are electrically connected to the first interconnection region 31. The joint face 701 is connected to the second material layer 82.

In an embodiment, a height H of each of the plurality of first solder balls 71 is greater than a preset height h between the top surface 401 of the molding layer 40 and the first interconnection region 31.

In this embodiment of the disclosure, by setting the height of each of the plurality of first solder balls to be greater than the height between the top surface of the molding layer and the first interconnection region, the second package structure can be tightly connected to the interposer layer. In addition, after the second package structure is connected to the interposer layer, there may be a gap between the second package structure and the molding layer. Therefore, the heat dissipation efficiency of a controller can be enhanced, and the impact of heat on chips can be reduced.

The second package structure 70 further includes a second base plate 72. A structure of the second base plate 72 is the same as or different from a structure of the base plate 10, which is not described herein again.

In this embodiment of the disclosure, the second package structure 70 further includes a joint face 701. The plurality of first solder balls 71 are located on the joint face 701, penetrate through the joint face 701, and are electrically connected to the second base plate 72.

In this embodiment of the disclosure, as shown in FIG. 6I, a material of the joint face 701 may be silicon dioxide. When the material of the joint face 701 is silicon dioxide, the second material layer 82 on the molding layer 40 is a silicon dioxide layer. Through such an arrangement, when the plurality of first solder balls 71 are bonded to the plurality of first pads 311, the molding layer 40 is bonded to the second package structure 70 by means of the second material layer 82.

In this embodiment of the disclosure, as shown in FIG. 4B, the second material layer 82 may be a copper layer, a tin layer, or a copper-tin layer. When the second material layer 82 may be a copper layer, a tin layer, or a copper-tin layer, a position on the joint face 701 corresponding to the second material layer 82 is provided with a copper layer, a tin layer, or a copper-tin layer. When the plurality of first solder balls 71 is bonded to the plurality of first pads 311, the molding layer 40 is bonded to the second package structure 70 by means of the second material layer 82.

In an embodiment, in the direction perpendicular to the first base plate 10, the molding layer 40 has a first thickness. The second package structure 70 includes a second molding layer 73. In the direction perpendicular to the first base plate 10, the second molding layer 73 has a second thickness. The first thickness is greater than or equal to the second thickness. In an embodiment, the second molding layer 73 includes an EMC material.

The second package structure 70 further includes a second semiconductor chip structure (not shown). The type of the second semiconductor chip structure is the same as or different from the type of the first chip stack body 20. The second semiconductor chip structure in the second package structure 70 is electrically connected to the second base plate 72.

For example, the second semiconductor chip structure may be a Universal File Store (UFS) chip.

In the embodiments of the disclosure, through the arrangement of the interposer layer, the subsequent second package structure may be connected to the first chip stack body and the first base plate by means of the first interconnection region on the interposer layer. Therefore, the interconnection among the chip structures with different types or different specifications can be realized, so as to cause a combination among different chip structures to be more flexible. In addition, since the first chip stack body and the subsequent second package structure connected to the first chip stack body are packaged independently, it is easier to perform test and failure analysis. In addition, the first material layer is formed on the sidewall between the top surface of the molding layer and the first interconnection region, so that a region where the interposer layer is in contact with the subsequent second package structure connected to the interposer layer can be protected.

The above are only preferred embodiments of the disclosure, and are not used to limit the scope of protection of the disclosure. Any modifications, equivalent replacements and improvements and the like made within the spirit and principle of the disclosure shall be included within the scope of protection of the disclosure.

What is claimed is:

1. A semiconductor package structure, comprising:

a first base plate provided with a first surface;

a first chip stack body located on the first base plate, wherein the first chip stack body comprises a plurality of first semiconductor chips that are successively stacked onto one another in a direction perpendicular to the first base plate, and the first chip stack body is electrically connected to the first surface of the first base plate;

an interposer layer located on the first chip stack body, wherein the interposer layer is provided with a first interconnection surface, the first interconnection surface is provided with a first interconnection region and a second interconnection region, and the first interconnection region is electrically connected to the first base plate; and a molding layer configured to seal the first chip stack body, the interposer layer and the first surface of the first base plate, wherein the first interconnection region is unsealed by the molding layer, the second interconnection region is sealed by the molding layer, and a first material layer is formed on a sidewall between the first interconnection region and a top surface of the molding layer on the second interconnection region;

wherein the first interconnection region comprises a plurality of first pads, and the second interconnection region comprises a plurality of second pads, wherein a number of the plurality of second pads is greater than a number of the plurality of first pads, and an area of each of the plurality of second pads is less than an area of each of the plurality of first pads.

2. The semiconductor package structure of claim 1, wherein a material of the first material layer comprises a conductive material or an insulation material.

3. The semiconductor package structure of claim 1, further comprising:

a second material layer located on the top surface of the molding layer, wherein a material of the second material layer is the same as a material of the first material layer.

4. The semiconductor package structure of claim 1, further comprising:

a plurality of first conductive wires, wherein each of the plurality of first semiconductor chips is electrically connected to the first base plate by means of a respective one of the plurality of first conductive wires; and a plurality of second conductive wires, wherein the second interconnection region is electrically connected to the first base plate by means of the plurality of second conductive wires.

5. The semiconductor package structure of claim 1, wherein the sidewall between the first interconnection region and the top surface of the molding layer forms a first angle with the direction perpendicular to the first base plate, wherein the first angle is greater than or equal to 0° and less than 90°.

6. A method for manufacturing a semiconductor package structure, comprising:

providing a first base plate, wherein the first base plate is provided with a first surface;

forming a first chip stack body on the first base plate, wherein the first chip stack body comprises a plurality of first semiconductor chips that are successively stacked onto one another in a direction perpendicular to the first base plate, and the first chip stack body is electrically connected to the first surface of the first base plate;

forming an interposer layer on the first chip stack body, wherein the interposer layer is provided with a first interconnection surface, the first interconnection surface is provided with a first interconnection region and a second interconnection region, and the first interconnection region is electrically connected to the first base plate;

forming a plurality of first pads on the first interconnection region; and forming a plurality of second pads on the second interconnection region, wherein a number of the plurality of second pads is greater than a number of the plurality of first pads, and an area of each of the plurality of second pads is less than an area of each of the plurality of first pads; and forming a molding layer, wherein the molding layer is configured to seal the first chip stack body, the interposer layer and the first surface of the first base plate, wherein the first interconnection region is unsealed by the molding layer, and the second interconnection region is sealed by the molding layer, wherein there is a preset height between the first interconnection region and a top surface of the molding layer on the second interconnection region, and a first material layer is formed on a sidewall between the first interconnection region and the top surface of the molding layer on the second interconnection region.

7. The method for manufacturing the semiconductor package structure of claim 6, further comprising:

after forming the interposer layer, forming a plurality of first conductive wires, wherein each of the plurality of first semiconductor chips is electrically connected to the first base plate by means of a respective one of the plurality of first conductive wires; and forming a plurality of second conductive wires, wherein the second interconnection region is electrically connected to the first base plate by means of the plurality of second conductive wires.

8. The method for manufacturing the semiconductor package structure of claim 6, further comprising:

after forming the interposer layer, forming a covering layer on the first interconnection region of the interposer layer, wherein the covering layer comprises a first portion and second portions located on two sides of the first portion, and the first portion and the second portions form an inverted U-shape to form a sealed cavity with the interposer layer; wherein an angle between each of the second portions and the direction perpendicular to the first base plate is a first angle, and the first angle is greater than or equal to 0° and less than 90°.

9. The method for manufacturing the semiconductor package structure of claim 8, wherein a material of the covering layer comprises a conductive material or an insulation material.

10. The method for manufacturing the semiconductor package structure of claim 8, further comprising:

forming a molding layer pre-layer which is configured to seal the first chip stack body, the interposer layer, the covering layer and the first surface of the first base plate; and removing a part of the molding layer pre-layer and the first portion of the covering layer, wherein the second portions are retained to form the first material layer.

11. The method for manufacturing the semiconductor package structure of claim 6, further comprising:

after forming the molding layer, forming a second material layer on the top surface of the molding layer, wherein a material of the second material layer is the same as a material of the first material layer.

12. The method for manufacturing the semiconductor package structure of claim 11, further comprising:

forming a second package structure, wherein the second package structure comprises a joint face and a first solder ball located on the joint face;

electrically connecting the first solder ball to the first interconnection region; and connecting the joint face to the second material layer.

13. A semiconductor package structure, comprising:

a first base plate provided with a first surface;

a first chip stack body located on the first base plate, wherein the first chip stack body comprises a plurality of first semiconductor chips that are successively stacked onto one another in a direction perpendicular to the first base plate, and the first chip stack body is electrically connected to the first surface of the first base plate;

an interposer layer located on the first chip stack body, wherein the interposer layer is provided with a first interconnection surface, the first interconnection surface is provided with a first interconnection region and a second interconnection region, and the first interconnection region is electrically connected to the first base plate; and a molding layer configured to seal the first chip stack body, the interposer layer and the first surface of the first base plate, wherein the first interconnection region is unsealed by the molding layer, the second interconnection region is sealed by the molding layer, and a first material layer is formed on a sidewall between the first interconnection region and a top surface of the molding layer on the second interconnection region;

a second package structure, wherein the second package structure comprises a first solder ball, and the first solder ball is electrically connected to the first interconnection region, wherein there is a preset height between the first interconnection region and the top surface of the molding layer on the second interconnection region, and a height of the first solder ball is greater than the preset height.

14. The semiconductor package structure of claim 13, wherein a material of the first material layer comprises a conductive material or an insulation material.

15. The semiconductor package structure of claim 13, further comprising:

a second material layer located on the top surface of the molding layer, wherein a material of the second material layer is the same as a material of the first material layer.

16. The semiconductor package structure of claim 13, further comprising:

a plurality of first conductive wires, wherein each of the plurality of first semiconductor chips is electrically connected to the first base plate by means of a respective one of the plurality of first conductive wires; and a plurality of second conductive wires, wherein the second interconnection region is electrically connected to the first base plate by means of the plurality of second conductive wires.

17. The semiconductor package structure of claim 13, wherein the sidewall between the first interconnection region and the top surface of the molding layer forms a first angle with the direction perpendicular to the first base plate, wherein the first angle is greater than or equal to 0° and less than 90°.

* * * * *